United States Patent
Tuncer

(10) Patent No.: US 11,658,101 B2
(45) Date of Patent: May 23, 2023

(54) ISOLATED TEMPERATURE SENSOR DEVICE PACKAGE

(71) Applicant: Texas Instruments Incorporated, Dallas, TX (US)

(72) Inventor: Enis Tuncer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 121 days.

(21) Appl. No.: 17/219,830

(22) Filed: Mar. 31, 2021

(65) Prior Publication Data
US 2022/0319966 A1 Oct. 6, 2022

(51) Int. Cl.
*H01L 23/495* (2006.01)
*H01L 21/48* (2006.01)
*H01L 21/56* (2006.01)
*H01L 23/34* (2006.01)
(Continued)

(52) U.S. Cl.
CPC .... *H01L 23/49568* (2013.01); *H01L 21/4821* (2013.01); *H01L 21/565* (2013.01); *H01L 23/3107* (2013.01); *H01L 23/34* (2013.01); *H01L 23/49513* (2013.01); *H01L 23/49558* (2013.01); *H01L 23/49586* (2013.01); *H01L 24/45* (2013.01); *H01L 24/48* (2013.01); *H01L 24/83* (2013.01); *H01L 2224/48175* (2013.01)

(58) Field of Classification Search
CPC ... H01L 2924/181; H01L 24/48; H01L 24/45; H01L 24/83; H01L 21/4821; H01L 21/565; H01L 23/4958; H01L 23/3107; H01L 23/34; H01L 23/49513; H01L 23/49558; H01L 23/49586
See application file for complete search history.

(56) References Cited

U.S. PATENT DOCUMENTS

| 6,137,165 A * | 10/2000 | Thierry | H01L 24/49 257/691 |
| 9,754,854 B2 | 9/2017 | Otremba et al. | |
| 10,581,426 B1 * | 3/2020 | Lin | H02M 1/08 |

(Continued)

OTHER PUBLICATIONS

Texas Instruments Incorporated, "Enhanced HotRod QFN Package:Achieving Low EMI Performance in Industry's Smallest 4-A Converter", Application Report SNVA935, pp. 1-12, Jun. 2020; accessed Mar. 30, 2021, https://www.ti.com/lit/an/snva935/snva935pdf?ts=1617208855579&ref_url=https%253A%252F%252Fwww.google.com%252Fh.

(Continued)

*Primary Examiner* — Alonzo Chambliss
(74) *Attorney, Agent, or Firm* — Dawn Jos; Frank D. Cimino

(57) ABSTRACT

In a described example, an apparatus includes: a package substrate having a die pad configured for mounting a semiconductor die, a first lead connected to the die pad, and a second lead spaced from and electrically isolated from the die pad; a spacer dielectric mounted on the die pad; a semiconductor die including a temperature sensor mounted on the spacer dielectric; electrical connections coupling the semiconductor die to the second lead; and mold compound covering the semiconductor die, the die pad, the electrical connections, and a portion of the package substrate, with portions of the first lead and portions of the second lead exposed from the mold compound to form terminals for a packaged temperature sensor device.

22 Claims, 11 Drawing Sheets

(51) Int. Cl.
    *H01L 23/31* (2006.01)
    *H01L 23/00* (2006.01)

(56) References Cited

U.S. PATENT DOCUMENTS

| | | | | |
|---|---|---|---|---|
| 2011/0233760 A1* | 9/2011 | Shiga | ............... | H01L 24/49 |
| | | | | 257/467 |
| 2013/0256857 A1* | 10/2013 | Gruber | ............... | H01L 24/83 |
| | | | | 257/E23.116 |
| 2014/0027891 A1* | 1/2014 | Kimura | ............... | H01L 24/83 |
| | | | | 438/122 |
| 2015/0061003 A1* | 3/2015 | Zundel | ............... | H01L 29/7813 |
| | | | | 257/334 |
| 2020/0321262 A1 | 10/2020 | Schweikert et al. | | |

OTHER PUBLICATIONS

PCT International Search Report, PCT/US2022/022710, dated Jul. 13, 2022, 3 pages.

\* cited by examiner

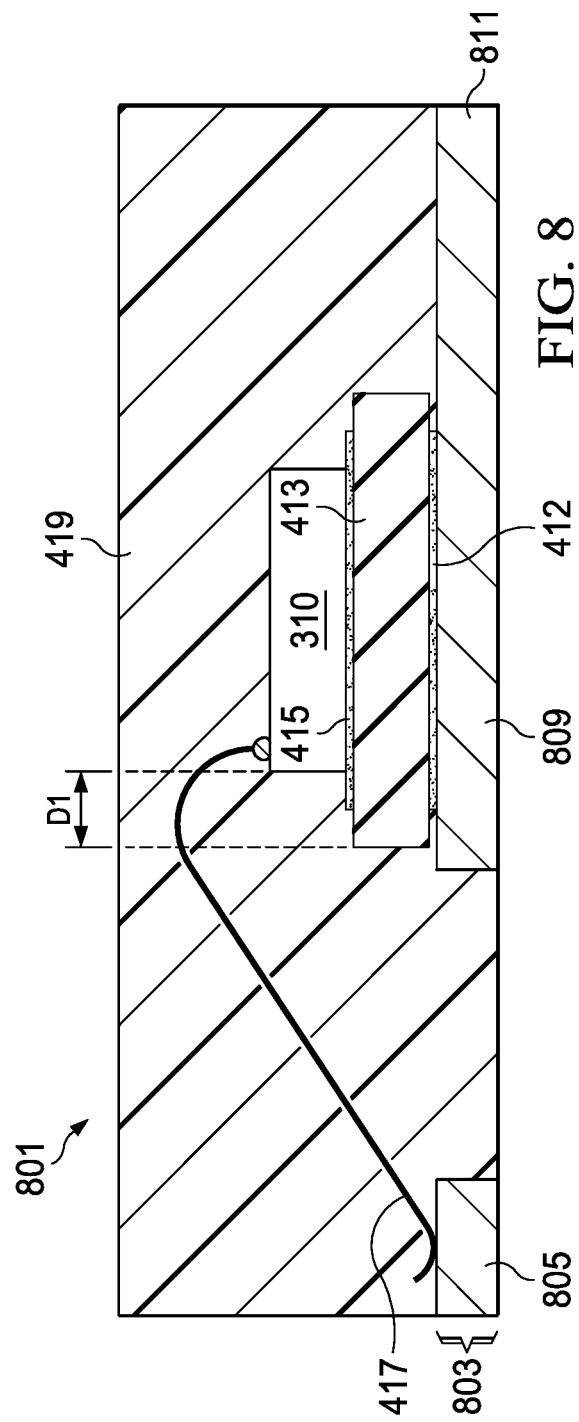

ISOLATED TEMPERATURE SENSOR DEVICE PACKAGE

TECHNICAL FIELD

This relates generally to packaging semiconductor temperature sensor devices, and more particularly to packaging for semiconductor temperature sensors including electrical isolation.

BACKGROUND

For semiconductor temperature sensors, a semiconductor device includes components with a parameter that varies with temperature which can be used to develop a signal that varies predictably with temperature. The circuit is a temperature sensor. Semiconductor temperature sensors can use an impedance, capacitance, inductance or a transistor voltage threshold as a temperature sensor device, and circuitry can be implemented to output a signal, a current or voltage, that depends on the temperature sensor device and which varies with temperature. In an example a capacitance is used which has permittivity that varies with temperature. In another example, an impedance or pairs of impedances can be used with a current source in a proportional-to-absolute-temperature ("PTAT") circuit. Delta-VBE temperature sensing using bipolar transistors with changes in a base-to-emitter voltage characteristic over temperature can be used.

When sensing temperature for high voltage applications, the semiconductor temperature sensor is exposed to the high voltage. Increasingly integrated devices are used for delivering increasing voltages, for example hundreds or thousands of volts, to a load. The area of a system where a temperature sensor is needed, for example a bus or a large conductor, may also have a high voltage on it. The semiconductor temperature sensor may not be capable of withstanding the electric field associated with the high voltage. Failures in the semiconductor temperature sensor can occur due to the dielectric breakdown voltage of the semiconductor device. Electrical isolation is needed for the temperature sensor device, even while the temperature sensor is thermally coupled to the conductor or bus, or other surface of interest. Optical sensors are sometimes used to achieve the electric isolation, however not all applications provide a signal that is appropriate for optical sensing. Improvements in semiconductor temperature sensors are needed.

SUMMARY

In an example an apparatus includes: a package substrate having a die pad configured for mounting a semiconductor die, a first lead connected to the die pad, and a second lead spaced from and electrically isolated from the die pad; a spacer dielectric mounted on the die pad; a semiconductor die including a temperature sensor mounted on the spacer dielectric; electrical connections coupling the semiconductor die to the second lead; and mold compound covering the semiconductor die, the die pad, the electrical connections, and a portion of the package substrate, with portions of the first lead and portions of the second lead exposed from the mold compound to form terminals for a packaged temperature sensor device.

BRIEF DESCRIPTION OF THE DRAWINGS

FIG. 8 illustrates, in a cross section, another arrangement for a packaged temperature sensor in a QFN package.

DETAILED DESCRIPTION

Figure 1:
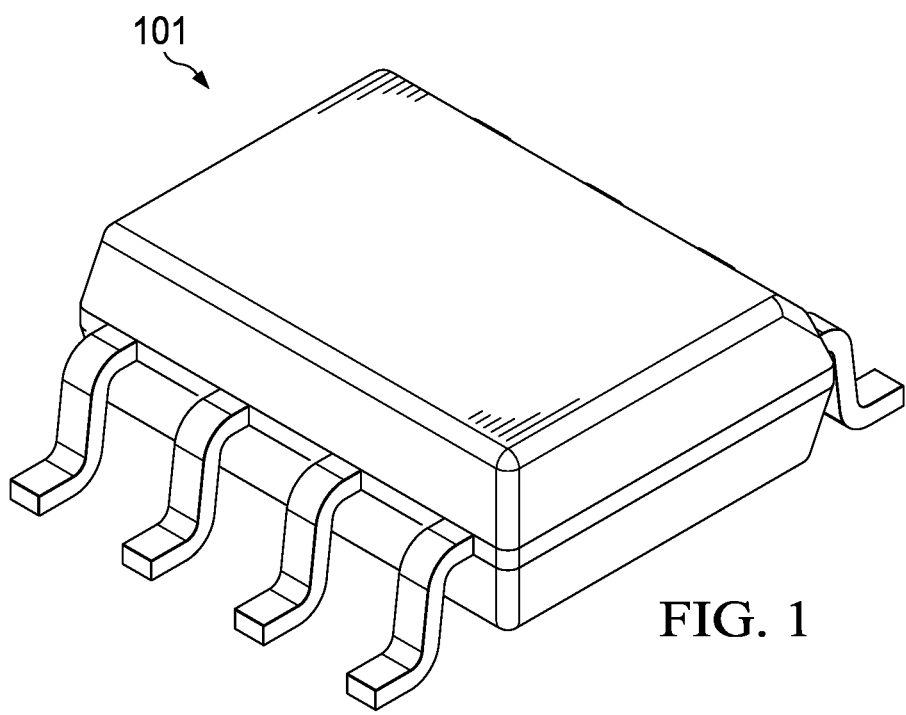
FIG. 1 is a projection view of a small outline integrated circuit (SOIC) semiconductor device package.

Corresponding numerals and symbols in the different figures generally refer to corresponding parts, unless otherwise indicated. The figures are not necessarily drawn to scale.

Elements are described herein as "coupled." As used herein, the term "coupled" includes elements that are directly connected, and elements that are electrically connected even with intervening elements or wires are coupled.

The term "semiconductor die" is used herein. As used herein, a semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or can include active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs). The semiconductor device can be a micro electro-mechanical system (MEMS) device, such as a digital micromirror device (DMD). Semiconductor dies for power applications include a discrete power transistor, a gate driver to operate the power transistor, passives such as capacitors, inductors, and resistors needed to implement power circuitry, and intelligent power devices that include protective sensors such as inrush current sensors that add reliability and control to the system. In some applications, these devices may be fabricated of different semiconductor materials, and can be separate semiconductor dies that are mounted in a single device package. In the arrangements, a semiconductor die includes a temperature sensor.

The term "packaged electronic device" is used herein. A packaged electronic device has at least one semiconductor die electronically coupled to terminals and has a package body that protects and covers the semiconductor die. In some arrangements, multiple semiconductor dies can be packaged together. For example, a power metal oxide semiconductor (MOS) field effect transistor (FET) semiconductor die and a second semiconductor die (such as a gate driver die or controller device die) can be packaged together to from a single packaged electronic device. Additional components such as passives can be included in the packaged electronic device. The semiconductor die is mounted to a package substrate that provides conductive leads, a portion of the conductive leads form the terminals for the packaged electronic device. The semiconductor die can be mounted to the package substrate with an active device surface facing away from the package substrate and a backside surface facing and mounted to the substrate. Alternatively, the semiconductor die can be flip-chip mounted with the active surface facing the substrate surface, and the semiconductor die is mounted to the leads of the substrate by conductive columns or solder balls. The packaged electronic device can have a package body formed by a thermoset epoxy resin in a molding process, or by the use of epoxies, plastics, or resins that are liquid at room temperature and are subsequently cured. The package body may provide a hermetic package for the packaged electronic device. The package body may be formed in a mold using an encapsulation process, however, a portion of the leads of the substrate are not covered during encapsulation, these exposed lead portions provide the exposed terminals for the packaged electronic device.

The term "package substrate" is used herein. A package substrate is a substrate arranged to receive a semiconductor die and to support the semiconductor die in a completed semiconductor package. Package substrates include conductive lead frames, which can be formed from copper, aluminum, stainless steel and alloys such as Alloy 42 and copper alloys. The lead frames can include a die pad for mounting the semiconductor die, and conductive leads arranged proximate to the die pad for coupling to bond pads on the semiconductor die using wire bonds, ribbon bonds, or other conductors. The lead frames can be provided in strips or arrays. Dies can be placed on the strips or arrays, the dies placed on a die pad for each packaged device, and die attach or die adhesive can be used to mount the dies to the lead frame die pads. Wire bonds can couple bond pads on the semiconductor dies to the leads of the lead frames. After the wire bonds are in place, a portion of the substrate, the die, and at least a portion of the die pad can be covered with a protective material such as a mold compound.

Alternative package substrates include pre-molded lead frames (PMLF) and molded interconnect substrates (MIS) for receiving semiconductor dies. These substrates can include dielectrics such as liquid crystal polymer (LCP) or mold compound and can include one or more layers of conductive portions in the dielectrics. The lead frames can include plated, stamped and partially etched lead frames, in a partially etched lead frame, two levels of metal can be formed by etching a pattern from one side of the metal lead frame, and then from the other side, to form full thickness and partial thickness portions, and in some areas, all of the metal can be etched to form openings through the partial etch lead frames. Repeated plating and patterning can form multiple layers of conductors spaced by dielectrics, and conductive vias connecting the conductor layers through the dielectrics, the dielectrics can be mold compound. The package substrate can also be tape-based and film-based substrates carrying conductors; ceramic substrates, laminate substrates with multiple layers of conductors and insulator layers; and printed circuit board substrates of ceramic, fiberglass or resin, or glass reinforced epoxy substrates such as FR4.

The term "quad flat no-lead" or "QFN" is used herein for a device package. A QFN package has leads that are coextensive with the sides of a molded package body and the leads are on four sides. Alternative flat no-lead packages may have leads on two sides or on one side. These can be referred to as "small outline no-lead" or "SON" packages. No lead packaged electronic devices can be surface mounted to a board. Leaded packages can be used with the arrangements where the leads extend away from the package body and are shaped to form a portion for soldering to a board. A dual in line package, or "DIP", can be used with the arrangements. A thin DIP package arranged with leads for surface mounting can be referred to as a small outline integrated circuit or "SOIC" package.

The term "high voltage" is used herein. As used herein a "high voltage" is a voltage greater than 50 Volts. The arrangements can be used in systems where hundreds or thousands of volts are being delivered to a load. In an example, a 4 kVrms signal was used. Further, even in examples where average voltage is less than these levels, transients must be considered that much greater. In an example where a 300 Vrms level is expected on a signal or buss, a transient voltage of 2500 Vrms must be handled, since when a signal switches from off to on, or vice versa, a transient of that level can occur. Voltage isolation between isolated elements must be able to handle both the expected load voltages, and transients that can occur.

The term "spacer dielectric" is used herein. A spacer dielectric as used herein is a dielectric material that has a thermal conductivity of greater than 10 Watts per meter-Kelvin (W/mK). Some spacer dielectrics useful in the arrangements are ceramics, composites, or glasses.

In the arrangements, a semiconductor die including a temperature sensor is thermally coupled to an input and is provided in a semiconductor device package where the semiconductor die is electrically isolated from an input, which may be at a high voltage, by use of a thermally conductive spacer dielectric within the package. A die pad of a package substrate is coupled to a first input or group of inputs that may be used to sense temperature at a signal or surface. A spacer dielectric of a sufficient thickness to provide electrical isolation is mounted to the die pad. A semiconductor die including a temperature sensor is mounted to the spacer dielectric and is thermally coupled to the die pad. By arranging the spacer dielectric to be of sufficient thickness, the temperature sensor can be thermally coupled to a signal or surface for sensing the temperature, while the semiconductor die is electrically isolated from the surface or signal. Even in a case where a surface being sensed is at a high voltage, the semiconductor die is isolated from the electric field in the package due that can occur due to the high voltage. Additional input and output signals that are also electrically isolated from the die pad can be used to provide control and data signals for the temperature sensor. Temperatures that can be expected for semiconductor devices in power applications can exceed 250 degrees C., for example over 300 degrees C. Temperature sensors are often applied at portions of systems where these high temperatures may occur, to enable shutting down components when an over temperature condition is detected, for example.

FIG. 1 illustrates in a projection view a DIP package that is useful with certain arrangements. The DIP package can be a small outline integrated circuit (SOIC) package which is thinner and takes less space on an system board than other DIP packages. In FIG. 1, device package 101 has eight leads extending from a body formed by use of a mold compound. Mold compounds used in semiconductor packaging can be used with the arrangements, for example thermoset epoxy resin mold compound can be used to cover the semiconductor die, portions of a package substrate such as a lead frame, and portions of the leads.

Figure 2:
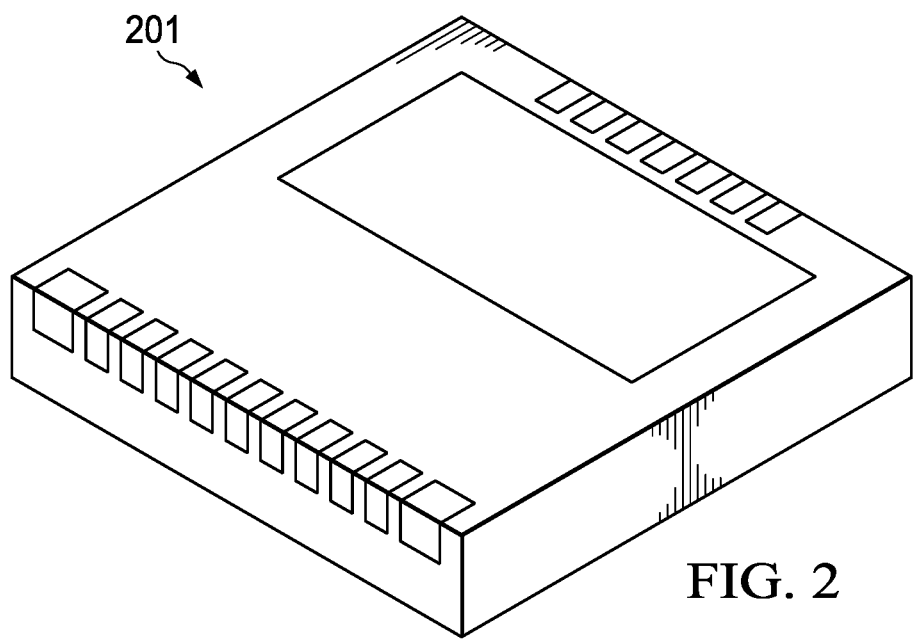
FIG. 2 is a projection view of a quad flat no-lead (QFN) semiconductor device package.

FIG. 2 illustrates, in another projection view, a board side surface of a QFN package useful with the arrangements. In FIG. 2, the QFN package 201 has a body formed from mold compound, and a die pad with an exposed surface, as well as terminals near the die pad for coupling to a signal bus, conductor, trace or surface to be sensed, and terminals space from the die pad that are electrically isolated from the die pad. The QFN package 201 can be surface mounted to a system board using solder and surface mount technology (SMT), QFN packages are increasingly used because the non-leaded package bodies require less board area than leaded packages, such as the DIP 101 in FIG. 1. The semiconductor die can be packaged in a DIP device package, an SOIC device package, in a QFN package, or in another semiconductor package type. Packages with leads or no-leads packages can be used with the arrangements. DIP, SOIC, QFN packages, small outline packages (SOP), small outline no-lead (SON) packages, and quad flat package (QFP) packages, as well as other packages for semiconductor devices, can be used with the arrangements.

Figure 3A:
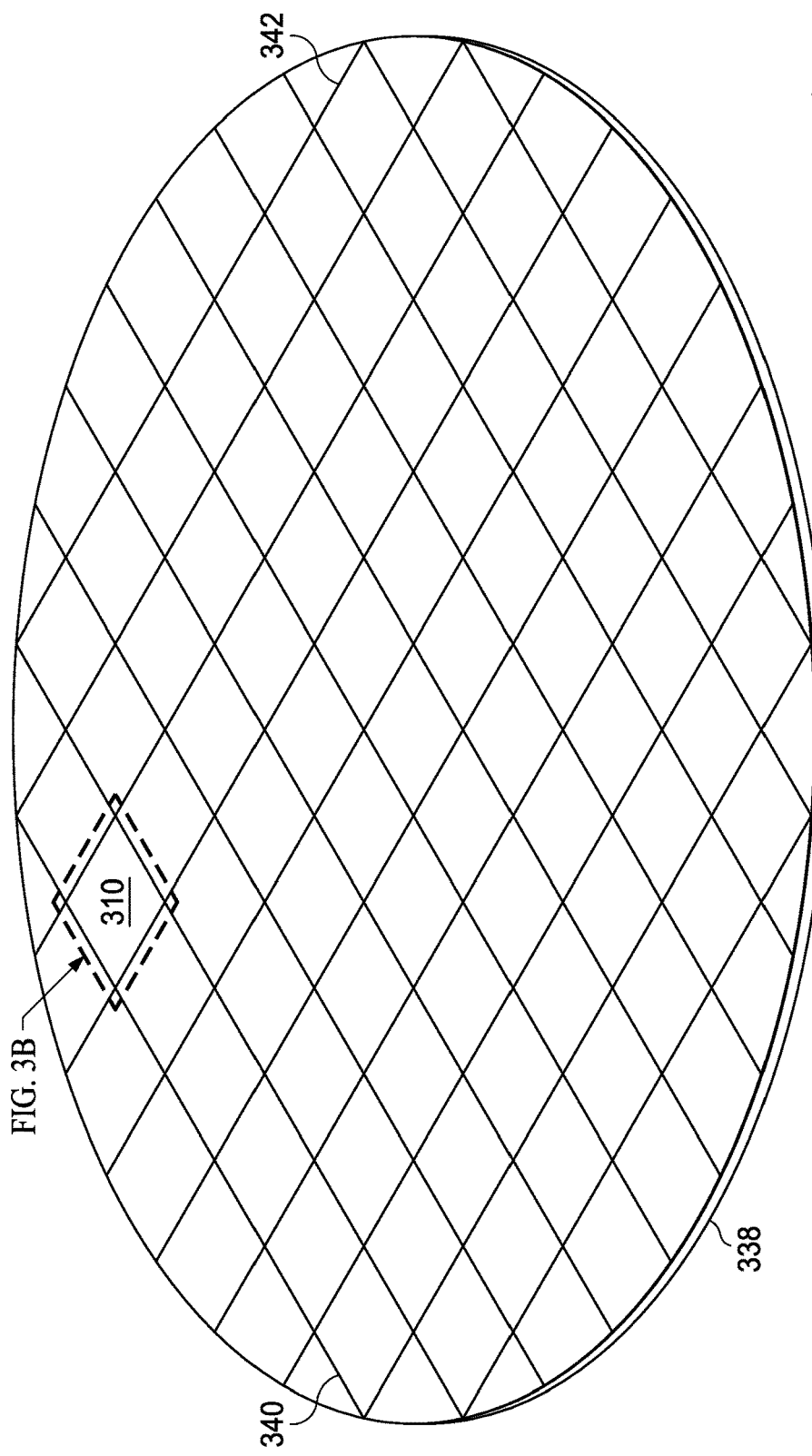
FIG. 3A is a projection view of a semiconductor wafer including semiconductor dies.
Figure 3B:
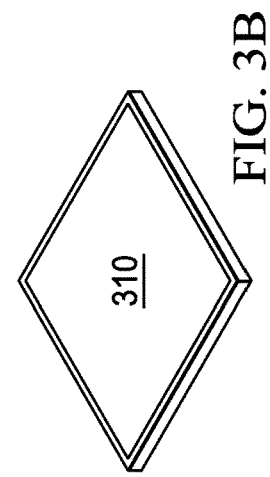
FIG. 3B is a projection view of a semiconductor die.

FIGS. 3A and 3B illustrate a semiconductor wafer including a plurality of semiconductor dies and a single semiconductor die after it has been removed from the semiconductor wafer in a singulation process, respectively. In FIG. 3A, a semiconductor wafer 338 is shown with a plurality of semiconductor dies 310 arranged in rows and columns and spaced by scribe lines 342, shown in a vertical direction as the semiconductor wafer 338 is oriented in FIG. 3A, and 340, shown in a horizontal direction in FIG. 3A. After semiconductor dies including a temperature sensor are manufactured using semiconductor fabrication processes, the wafer is singulated into unit dies by the use of a saw or laser cutting tool to cut the dies 310 apart from the wafer 338 along the scribe lines 340 and 342. FIG. 3B illustrates a single rectangular semiconductor die such as can be used in the arrangements. A temperature sensor circuit can be formed on the semiconductor die 310 using any one of several types of sensor circuits and including at least one component that has a characteristic which varies predictably with device temperature.

Figure 4:
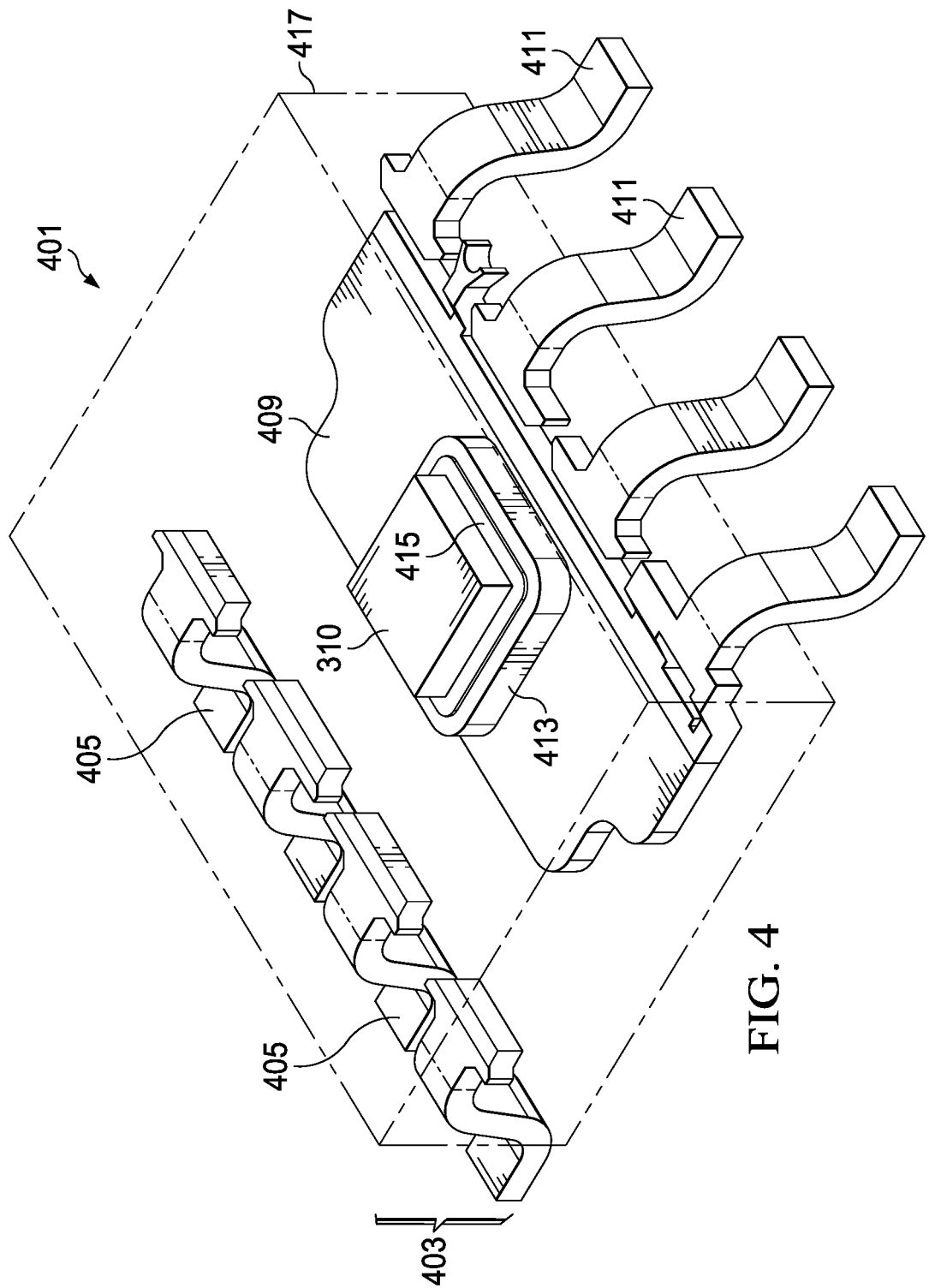
FIG. 4 illustrates, in a projection view, a semiconductor device package of an arrangement for a temperature sensor.

FIG. 4 illustrates in a projection an example arrangement 401 using a SOIC DIP package to package a temperature sensor. In FIG. 4, a semiconductor die 310 is shown mounted on a package substrate 403. In the illustrated example of FIG. 4 the package substrate is a metal lead frame, such as a copper lead frame. Other conductive lead frame materials can be used, such as stainless steel and Alloy 42. Partially etched or half etched lead frames can be used. PMLF substrates, including conductors spaced by dielectric material such as mold compound, MIS substrates, and other substrates used in semiconductor packaging can be used.

Package substrate 403 includes a die pad 409, and a first lead or group of leads 411 coupled to the die pad 409. The leads 411 shown at one side of the arrangement 401 may be an input for the device and may be attached to a surface or conductor where the temperature is to be sensed, such as a bus trace on a system board. Package substrate 403 also includes a second group of leads 405 of package substrate 403 is shown at a side opposite the first group of leads. The second group of leads 405 is electrically isolated from the die pad 409 and the first group of leads 411, and as is described below, a lead or leads 405 can be electrically connected to the semiconductor die 310, by bond wires for example, to use in communication with external devices.

A spacer dielectric 413 is shown mounted on die pad 409. The spacer dielectric can be one of several dielectric materials that are thermal conductors and electric isolators, and can be a ceramic material. Examples that are useful in the arrangements include aluminum nitride (AlN), aluminum oxide ($Al_2O_3$), titanium oxide ($TiO_2$), hafnium oxide ($HfO_2$), barium titanium oxide (BTO), molybdenum disulfide (MoS), silicon carbide (SiC), glasses, and composites made of multiple materials. The spacer dielectric 413 can have varying thicknesses with a particular thickness determined by the properties of the material, and by the needs of a particular application. The spacer dielectric in the arrangements will have a thermal conductivity of greater than or equal to 10 W/mK. The spacer dielectric in the arrangements is an electrical insulator. By using the spacer dielectric in a package to thermally couple the semiconductor die to the pad and also a lead, and by electrically isolating the semiconductor die from the die pad, the semiconductor die is protected from the electric field due to the high voltage on the die pad. In one example, a spacer dielectric of AlN was used at a thickness of 125 microns, and in another example, AlN was used at thickness of 250 microns. AlN has a thermal conductivity of 160 W/mK at 25 degrees C. As is further detailed below, in both examples simulations show that the electric field in the semiconductor die is less than 10 Volts/micron, with a 4 kVrms voltage input at the input leads 411. Spacer dielectric 413 may have planar surfaces, or may have a cup shaped recess for receiving the semiconductor die 310 in a surface, as is further described below. A die attach material 415 is used to attach the semiconductor die 310 to the spacer dielectric 413, which can be a conductive die attach, a non-conductive die attach, or a non-conductive die attach film. Another die attach is also used to attach spacer dielectric 413 to die pad 409 (not visible in FIG. 4) which can be the same die attach material or another die attach material. Die attach epoxies or die attach films, both conductive and non-conductive types, can be used to form arrangements. Mold compound 417 forms the package body and covers the semiconductor die 310, the die pad 409, and portions of leads 405 and 411, while other portions extend from the mold compound to form terminals for the packaged semiconductor device of arrangement 401. Use of the spacer dielectric with high thermal conductivity and high electrical isolation results in a temperature sensor in the semiconductor device 310 that is electrically isolated from leads 411, which are configured to be mounted to a high voltage area where temperature is to be measured, while being thermally coupled to the leads 411.

Figure 5A:
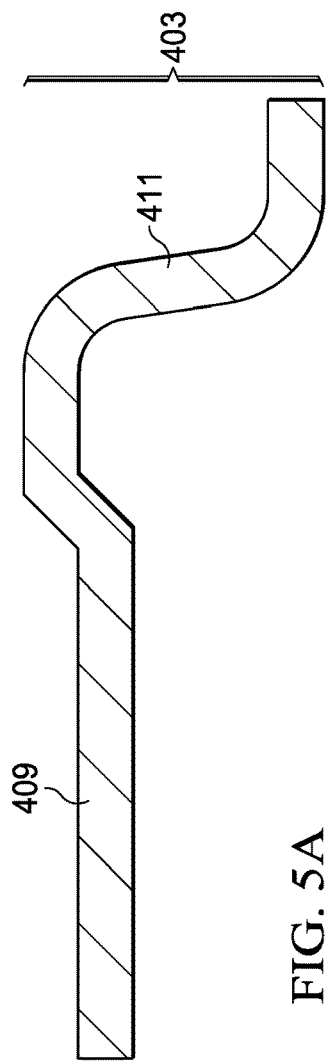
FIGS. 5A-5E illustrate in cross sectional views selected steps in forming a packaged temperature sensor in an arrangement.

FIGS. 5A-5E illustrate, in a series of cross sectional views, a method for forming an arrangement. In FIG. 5A, the package substrate 403, which in this example is a metal lead frame, has leads 411 coupled to the die pad 409, which is configured for mounting devices. Although several leads 411 are shown in FIG. 4, in another example arrangement, one lead or many leads 411 can be used. Using multiple leads in parallel to a common signal reduces resistance and may improve performance in some applications. Leads 405 are spaced from the die pad 409 and will be electrically isolated from the die pad 409 and the leads 405.

Figure 5B:
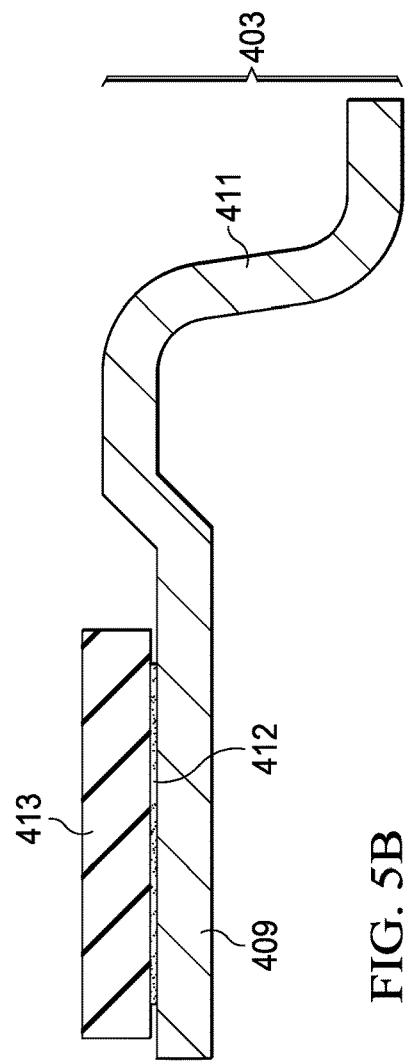

FIG. 5B illustrates, in another cross section, the arrangement of FIG. 5A after additional processing. In FIG. 5B, spacer dielectric 413 is shown mounted to die pad 409. Die attach 412 is used to mount the spacer dielectric 413. The die attach material can be a conductive die attach. The die attach material can be a non-conductive die attach, however, because in the presence of a high voltage at the input (leads 411) any voids in a non-conductive die attach can cause a concentration in an electric field between the die pad 409 and the spacer dielectric 413, the non-conductive die attach should be void free to avoid concentrated electric fields that might occur in voids of non-conductive die attach. A non-conductive die attach film (NCDAF) may be used to form a void free non-conductive die attach layer. Spacer dielectric 413 can be of one of several insulators that are thermally conductive and are good electric isolators. Aluminum nitride (AlN) is one example of a ceramic that is useful in the arrangements. The thickness of the spacer dielectric 413 can vary, from about 50 ums to several hundred microns. In particular examples, a thickness of 125 microns was evaluated and a thickness of 250 microns was evaluated using AlN ceramic in an SOIC package with 8 terminals. A stress volume characteristic Sv/t observed for packages using spacer dielectrics at these thicknesses were similar to mold compound, and so these materials are appropriate for package applications. AlN has little change in permittivity over a broad temperature range, and has low electrical conductivity over a range of temperatures, including temperatures greater than 200 degrees C. Other materials with similar characteristics can be used, including other ceramics such as aluminum oxide ($Al_2O_3$), titanium oxide ($TiO_2$), hafnium oxide ($HfO_2$), and barium titanium oxide (BTO), molybdenum disulfide (MoS), silicon carbide (SiC), glass, and composites made of multiple layers of these materials or including these materials.

Figure 5C:
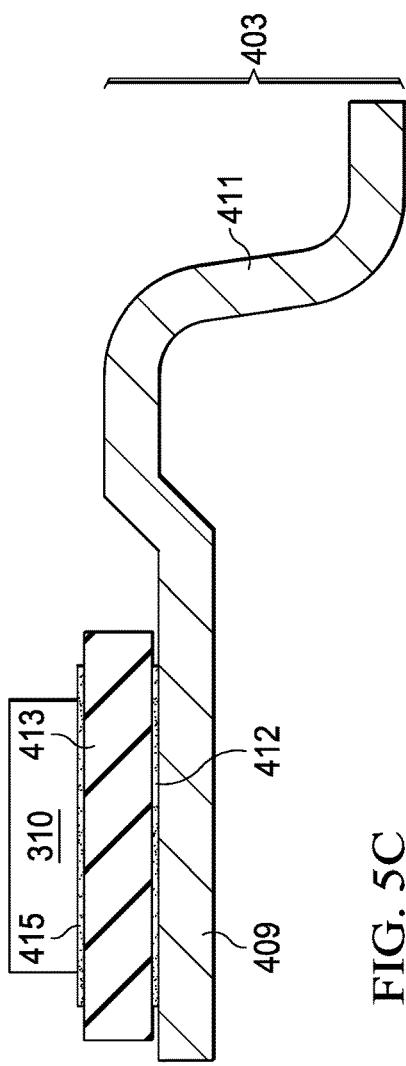

FIG. 5C illustrates, in another cross section, the structure of FIG. 5B after further processing. In FIG. 5C, semiconductor die 310 is mounted to the spacer dielectric 413 using a second die attach 415. The second die attach 415 can be the same material as die attach 412 or can be of different die attach material. Conductive die attach can be used. Non-conductive die attach film can be used, as described above. Semiconductor die 310 includes a component or components that are configured as temperature sensors. Semiconductor die is thermally coupled to die pad 409 and leads 411, but is electrically isolated from both. Because the spacer dielectric 413 provides electrical isolation, the semiconductor die 310 experiences a lower electric field even when high voltages are applied to leads 411, at the input to the package of the example arrangement.

In FIG. 5C, the spacer dielectric 413 is shown having planar exterior surfaces for mounting to the die pad (the lower surface of spacer dielectric 413, as oriented in FIG. 5C) and for mounting the semiconductor die 310 (the upper surface of spacer dielectric 413 as oriented in FIG. 5C). In an alternative arrangement (not shown), spacer dielectric 413 can have a recessed upper surface to form a cup shape for receiving the semiconductor die 310, which can add additional isolation for the semiconductor die 310 by covering the sides of the semiconductor die 310.

Figure 5D:
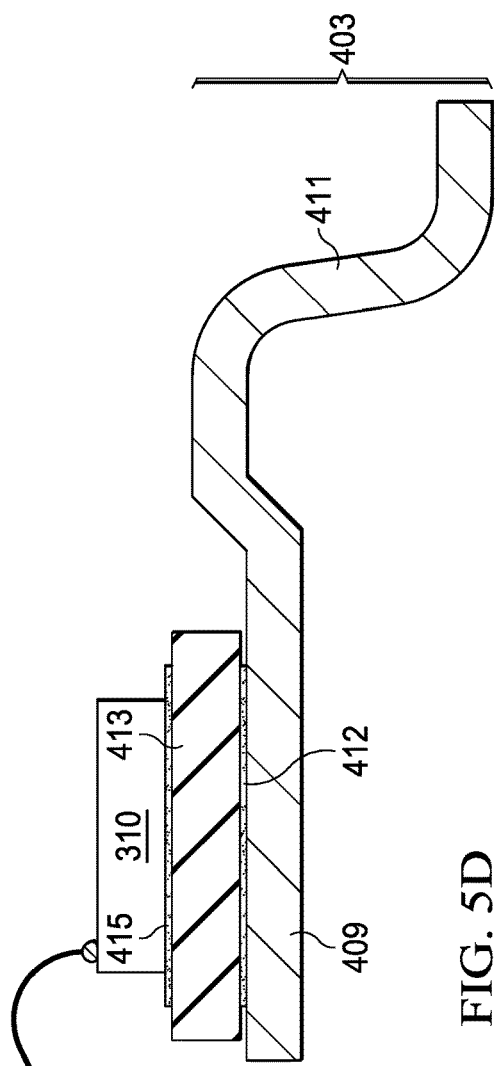

FIG. 5D illustrates, in another cross section, the structure of FIG. 5C after additional processing. In FIG. 5D, bond wires 417 are used to couple the semiconductor die to the leads 405. Leads 405 are electrically isolated from the die pad 409 and leads 411. Leads 405 can be coupled to input and output signals to allow for communication between semiconductor die 310 and an external device. Signals needed for the semiconductor die 310 to operate, including power, ground and clock signals, can be provided at leads 405.

Figure 5E:
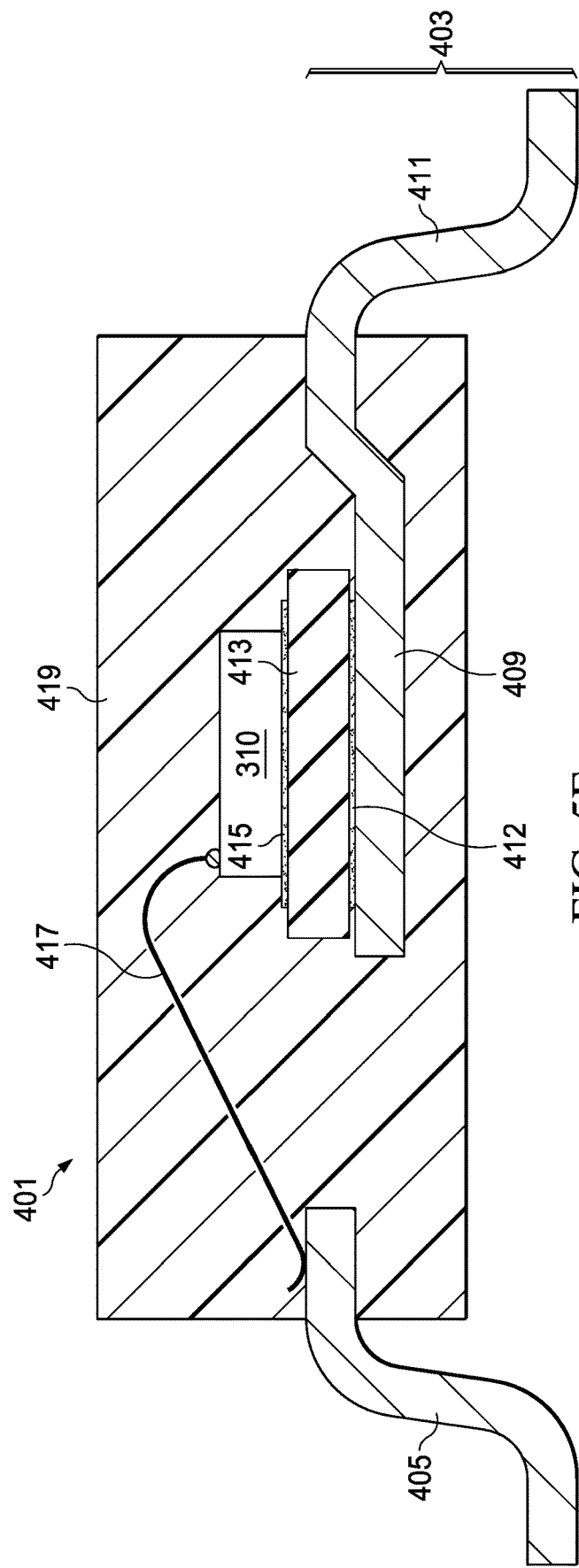

FIG. 5E illustrates in another cross section, the packaged device 401 after an encapsulation molding process is performed on the structure of FIG. 5D. Mold compound 419 can be applied by a molding process such as a transfer molding process using a thermoset epoxy resin mold compound. Thermoset mold compound can be provided as a solid puck or powder, heated to liquefy the mold compound, and allowed to flow into a mold to cover the die pad, the semiconductor die, the spacer dielectric, the bond wires, the die attach, and portions of the leads 405 and 411 of package substrate 403. The mold compound cures to form a solid package body 419. Portions of leads 405, 411 are left exposed from the mold compound 419 to form leads for mounting the device to a printed circuit board. Other materials can be used such as resins, epoxies, and plastic to cover the devices and form the body of the package.

Figure 6:
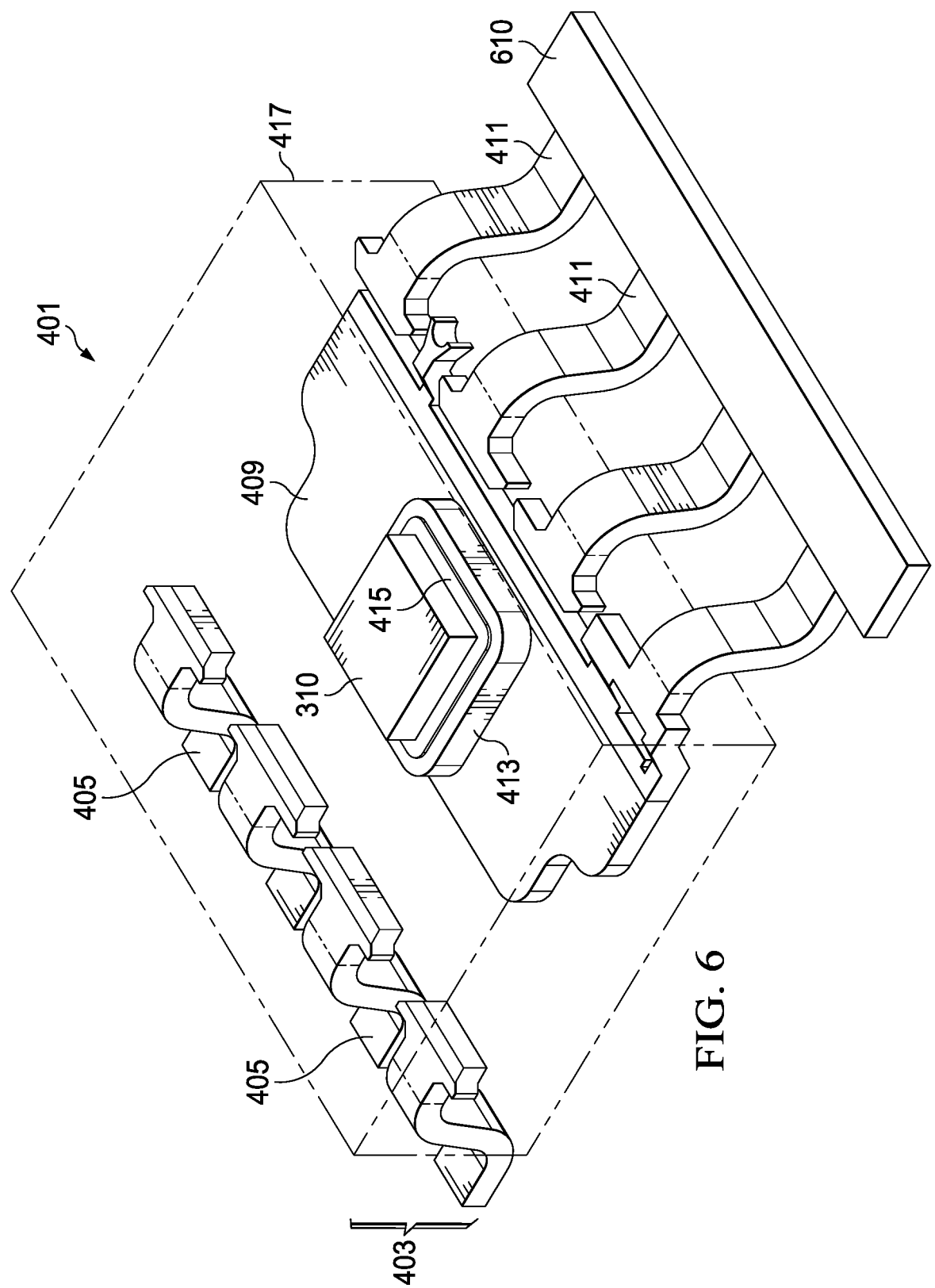
FIG. 6 illustrates in a projection view a packaged temperature sensor of the arrangement coupled to a bus.

FIG. 6 illustrates in an example application the packaged temperature sensor device package 401 coupled to a bus 610 to sense temperature of the bus 610. The leads 411 couple the bus 610 to the device 401, with die pad 409 inside the packaged device thermally and electrically coupled to the bus 610. The semiconductor die 310 is thermally coupled to the bus 610, but is electrically isolated from it by spacer dielectric 413.

Figure 7A:
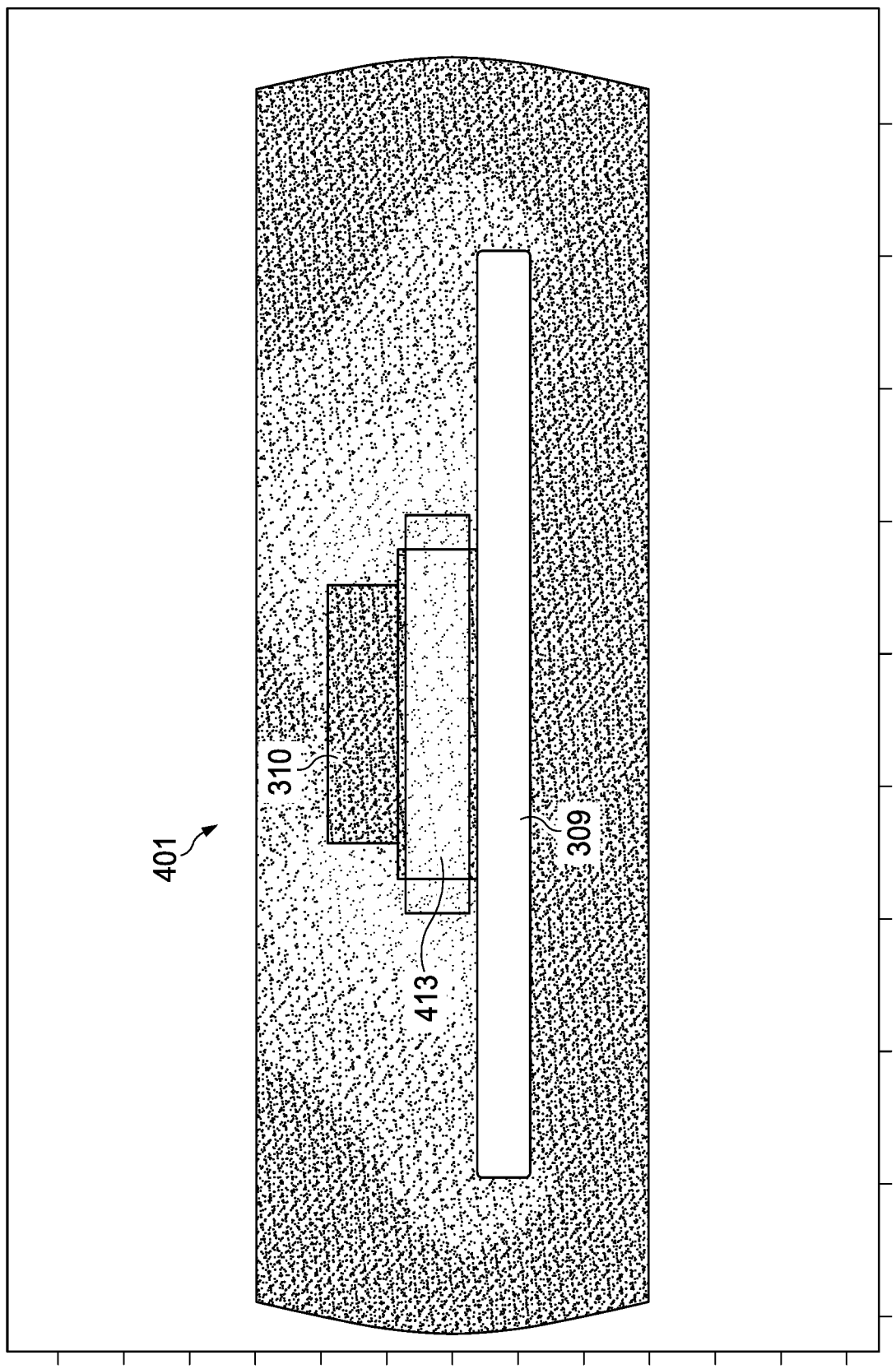
FIGS. 7A-7B are graphs that illustrate electric field strength simulation results for example arrangements.

FIG. 7A illustrates in a graph the electric field observed in simulations within the packaged device 401 when a 4 kVrms signal is applied to the leads 411 using an AlN spacer of 250 microns thickness. As seen in FIG. 7A, the darker areas have lower electric field Ev, while lighter areas indicate larger electric fields. The maximum electric field observed was 22 V/um within the spacer dielectric of AlN. The field in the semiconductor device 310 was much lower, as indicated by the dark shading, and was less than 10 V/um.

Figure 7B:
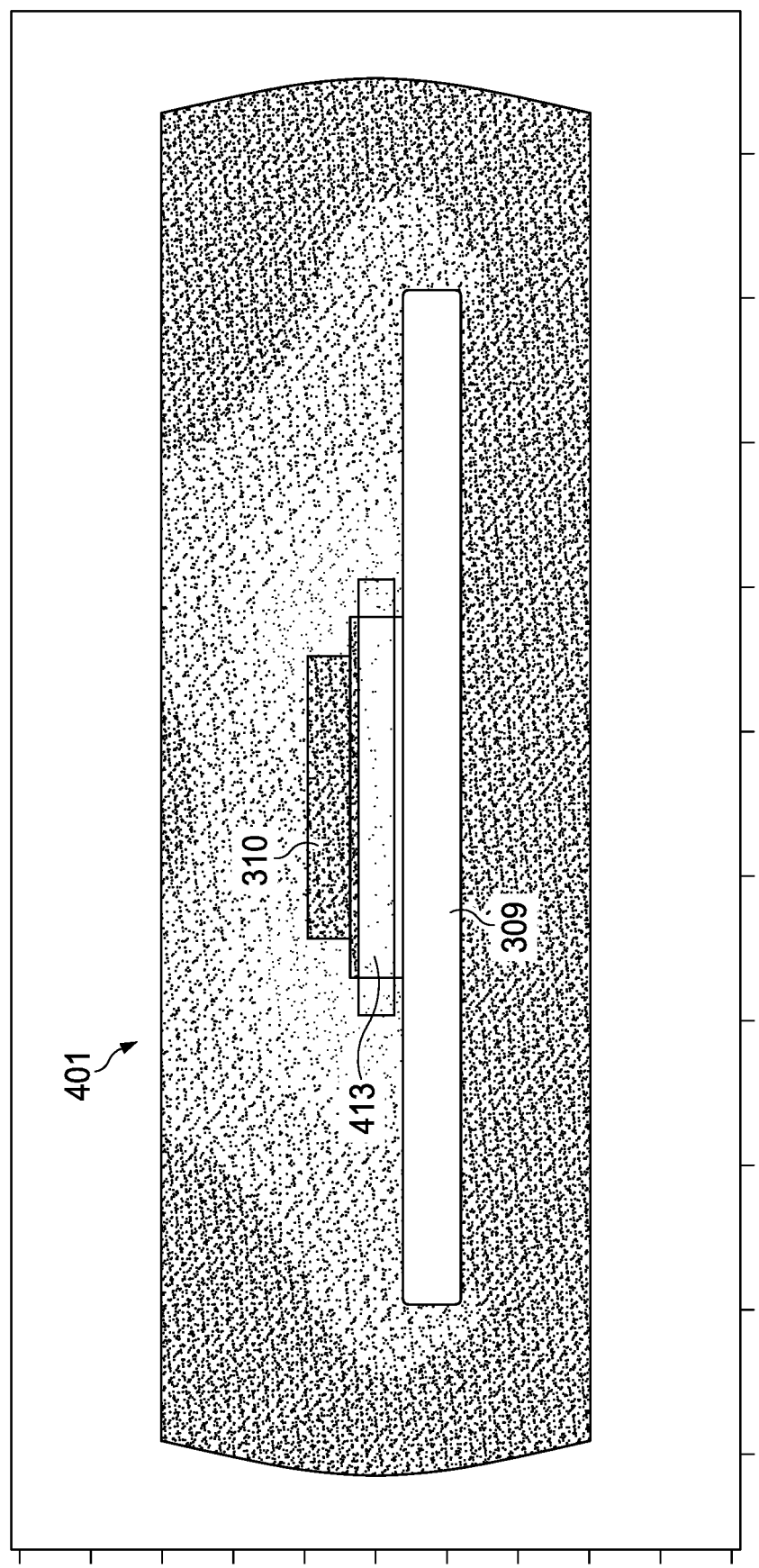

FIG. 7B illustrates in another graph the electric field observed within the packaged device 401 when a 4 kVrms signal is applied to the leads 411 using an AlN spacer of 125 microns thickness. As seen in FIG. 7B, the darker areas have lower electric field, while lighter areas indicate larger electric fields. The maximum electric field observed was 44 V/um in the spacer dielectric of 125 microns of AlN. The field in the semiconductor device 310 was much lower in this example as well, and again was less than 10 V/um.

FIG. 8 illustrates in an alternative arrangement a packaged device 801 in a QFN package. Mold compound 419 covers a semiconductor die 310 including a temperature sensor, which is attached to a spacer dielectric 413 by a die attach layer 415. A second die attach 412 is used to attach the spacer dielectric 413 to the die pad 809 of a package substrate 803, which can be a metal lead frame. Leads 811 are physically attached and electrically coupled to the die pad and provide a thermal connection to the die pad from an input of the packaged device 801. Leads 805 are electrically isolated from the die pad 809 and leads 811, and are connected to the semiconductor die 310 by bond wires. Ribbon bonds or another electrical connection can be used to couple leads 805 to the semiconductor die 310. The mold compound covers portions of the package substrate 803 but leaves portions of leads 805, die pad 809 and leads 811 exposed to make thermal and electrical connections to the packaged device 801.

FIG. 8 illustrates an overhang distance D1 used in the arrangements. The spacer dielectric 413 has an overhang extending past the edge of the semiconductor die 310 by a distance of at least 10 mils, or 0.254 mm. This overhang ensures a minimum creepage distance is maintained between the die pad (809 in FIG. 8) and the die 310, to prevent unwanted electric coupling such as an arc from the die pad to the semiconductor die when a high voltage is present. By having the spacer dielectric with a greater width on all sides than the die, so that it overhangs the die on all four sides, the creepage distance is increased, preventing arcing between the die pad and the semiconductor die.

In alternative arrangements, the spacer dielectric can have metal plates on the planar surfaces where the die attach is shown, and when metal plates are present on the spacer dielectric, solder can be used to attach the die 310 to the spacer dielectric 413, and to attach the spacer dielectric 413 to the die pad 809 of the metal lead frame. The metal plates should also be spaced from the edge of the spacer dielectric and be of similar size as the die 310, so that the creepage distance between the die pad 809 or 309 and the die 310 is maintained.

Figure 9:
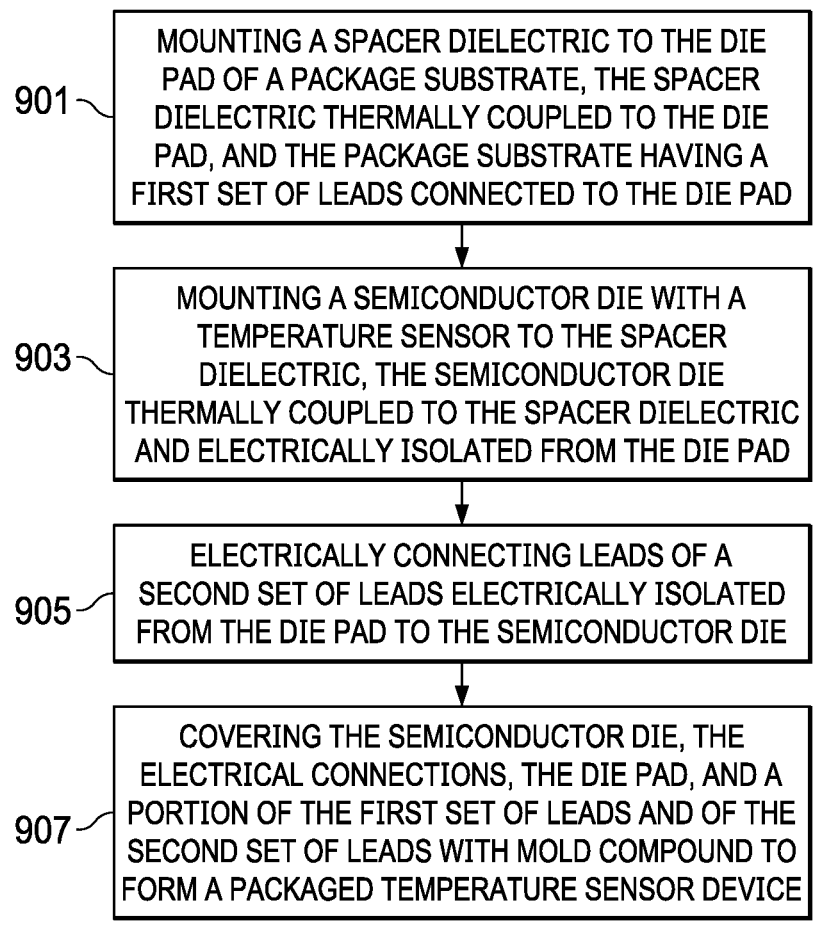
FIG. 9 illustrates in a flow diagram a method for forming a packaged temperature sensor device of the arrangements.

FIG. 9 illustrates, in a flow diagram, a method for forming an arrangement. In step 901, a spacer dielectric is mounted to a die pad of a package substrate, and the package substrate has at least one first lead connected to the die pad (see FIG. 5B, spacer dielectric 413 is mounted on die pad 409 of package substrate 403, with lead 411 attached to the die pad 409). At step 903, the method continues by mounting a semiconductor die including a temperature sensor to the spacer dielectric (see FIG. 5C, semiconductor die 310 is mounted to spacer dielectric 413). The spacer dielectric provides a thermal coupling between the semiconductor die and the die pad, which is also thermally coupled to the first lead. The semiconductor die is electrically isolated from the die pad by the spacer dielectric. At step 905, the method continues by electrically connecting a lead from a second set of leads that are electrically isolated from the die pad to the semiconductor die, the electrical connections can be formed by wire bonding, or by ribbon bonding (see FIG. 5D where bond wire 417 couples the second leads 405 to the semiconductor die 310). The second set of leads are isolated from the die pad.

At step 907, the method completes by covering the semiconductor die, the die pad, and portions of the first and second set of leads with mold compound to form a packaged temperature sensor device (see FIG. 5E, where mold compound 419 covers the elements). Encapsulation using a thermoset resin epoxy mold compound can be used.

The packaged temperature sensor device can be used as shown in FIG. 6 by coupling the lead or leads 411 to a bus or surface where temperature is measured. Alternative applications include mounting a QFN package such as 801 shown in FIG. 8 with the exposed portion of the die pad in thermal contact with a surface or conductor on a board, module, or device where temperature is to be sensed. When a high voltage is present at the surface to be sensed, the semiconductor die is electrically isolated from the high voltage so that the temperature sensor is not damaged due to dielectric breakdown in the presence of an electric field associated with the high voltage.

Modifications are possible in the described arrangements, and other alternative arrangements are possible within the scope of the claims.

What is claimed is:

1. An apparatus, comprising:
a package substrate having a die pad configured for mounting a semiconductor die, a first lead connected to the die pad, and a second lead spaced from and electrically isolated from the die pad;
a spacer dielectric mounted on the die pad;
a semiconductor die including a temperature sensor mounted on the spacer dielectric;
electrical connections coupling the semiconductor die to the second lead; and
mold compound covering the semiconductor die, the die pad, the electrical connections, and a portion of the package substrate, with portions of the first lead and portions of the second lead exposed from the mold compound to form terminals for a packaged temperature sensor device.

2. The apparatus of claim 1, wherein the spacer dielectric comprises aluminum nitride.

3. The apparatus of claim 1, wherein the spacer dielectric is one selected from:
aluminum nitride (AlN), aluminum oxide ($Al_2O_3$), titanium oxide ($TiO_2$), hafnium oxide ($HfO_2$), and barium titanium oxide (BTO), molybdenum disulfide (MoS), silicon carbide (SiC), composites of these, and glass.

4. The apparatus of claim 1 wherein the spacer dielectric has a thermal conductivity of greater than 10 W/mK.

5. The apparatus of claim 1, wherein the spacer dielectric has a thickness of between 50 microns and 500 microns.

6. The apparatus of claim 1, wherein the spacer dielectric has a thickness selected from 125 microns and 250 microns.

7. The apparatus of claim 6, wherein the spacer dielectric is AlN.

8. The apparatus of claim 1, wherein the semiconductor die is mounted in a recess in a surface of the spacer dielectric.

9. The apparatus of claim 1, wherein the electrical connections further comprise bond wires.

10. The apparatus of claim 1, wherein the semiconductor die has a first width, and the spacer dielectric has a second width that is greater than the first width so that the spacer dielectric has an edge that overhangs an edge of the semiconductor die by a distance of at least 10 mils on all four sides of the semiconductor die.

11. The apparatus of claim 1, wherein the spacer dielectric is mounted to the die pad by a conductive die attach.

12. The apparatus of claim 1, wherein the spacer dielectric is mounted to the die pad by a non-conductive die attach film.

13. The apparatus of claim 1, wherein the semiconductor die is mounted to the spacer dielectric by a conductive die attach.

14. The apparatus of claim 1, wherein the semiconductor die is mounted to the spacer dielectric by a non-conductive die attach film.

15. The apparatus of claim 1, wherein the spacer dielectric has metal platings on a first surface and on a second opposite surface, and the spacer dielectric is mounted to the die pad by solder between the first surface and the die pad, and the semiconductor die is mounted to the second surface of the spacer dielectric by solder.

16. The apparatus of claim 1, wherein the package substrate is one of a lead frame, a partially etched lead frame, a pre-molded lead frame (PMLF), a molded interconnect substrate (MIS), and a printed circuit board.

17. A packaged temperature sensor device, comprising:
a first lead configured to be coupled to sense a temperature of a conductive element;
a die pad of a metal lead frame that is connected to the first lead;
a spacer dielectric that is mounted to the die pad;
a semiconductor die that is mounted to the spacer dielectric;
a second lead of spaced from the die pad and the first lead, and electrically isolated from the die pad;
bond wires connecting the second lead to the semiconductor die; and
mold compound covering the semiconductor die, the die pad, the spacer dielectric, and portions of the first lead and the second lead, while additional portions of the first lead and the second lead are exposed from the mold compound, forming terminals for the packaged temperature sensor device.

18. The packaged temperature sensor device of claim 17 wherein the spacer dielectric has a thermal conductivity that is greater than 10 W/mK.

19. The packaged temperature sensor device of claim 17, wherein the spacer dielectric is one selected from aluminum nitride (AlN), aluminum oxide ($Al_2O_3$), titanium oxide ($TiO_2$), hafnium oxide ($HfO_2$), and barium titanium oxide (BTO) molybdenum disulfide (MoS), silicon carbide (SiC), composites of these, and glass.

20. The packaged temperature sensor device of claim 17 wherein the spacer dielectric has a thickness between 50 microns and 500 microns.

21. The packaged temperature sensor device of claim 17 wherein the die pad, the first lead, and the second lead comprise portions of a package substrate that is one selected from a lead frame, a partially etched lead frame, a pre-molded lead frame (PMLF), and a molded interconnect substrate (MIS).

22. A method, comprising:
mounting a spacer dielectric on a die pad of a package substrate, the package substrate having a first lead connected to the die pad and configured to be coupled to a surface to monitor a temperature of the surface;

mounting a semiconductor die to the spacer dielectric, the semiconductor die having a temperature sensor and the semiconductor die thermally coupled to the die pad and the first lead, and the semiconductor die electrically isolated from the die pad and the first lead;

electrically connecting the semiconductor die to a second lead of the package substrate, the second lead spaced from the die pad and the first lead, and the second lead electrically isolated from the die pad and the first lead; and covering the semiconductor die, the spacer dielectric, the die pad, and a portion of the package substrate including portions of the first lead and portions of the second lead, with mold compound to form a device package, while additional portions of the first lead and additional portions of the second lead remain exposed from the mold compound to form terminals of the device package.

* * * * *